(12) United States Patent
Wang

(10) Patent No.: US 7,906,853 B2
(45) Date of Patent: Mar. 15, 2011

(54) PACKAGE STRUCTURE FOR MULTIPLE DIE STACK

(75) Inventor: Low Peng Wang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 491 days.

(21) Appl. No.: 11/899,523

(22) Filed: Sep. 6, 2007

(65) Prior Publication Data

US 2009/0065948 A1    Mar. 12, 2009

(51) Int. Cl.
H01L 23/48    (2006.01)
(52) U.S. Cl. .......................... 257/777; 257/686
(58) Field of Classification Search .................. 257/777, 257/678, 685, 686
See application file for complete search history.

(56) References Cited

U.S. PATENT DOCUMENTS

| | | | |
|---|---|---|---|
| 5,973,403 A * | 10/1999 | Wark | 257/777 |
| 6,351,028 B1 | 2/2002 | Akram | |
| 6,441,496 B1 | 8/2002 | Chen et al. | |
| 6,563,205 B1 | 5/2003 | Fogal et al. | |
| 6,753,599 B2 | 6/2004 | Kim | |
| 6,900,528 B2 * | 5/2005 | Mess et al. | 257/686 |
| 6,919,628 B2 | 7/2005 | Lee et al. | |
| 7,192,847 B2 | 3/2007 | Hsuan | |
| 2002/0113325 A1 | 8/2002 | Kim | |
| 2003/0178710 A1 | 9/2003 | Kang et al. | |
| 2007/0015314 A1 | 1/2007 | Lee et al. | |
| 2009/0032969 A1 * | 2/2009 | Pilla | 257/777 |

OTHER PUBLICATIONS

Stats ChipPac Adds Two Die Stack Package-on-Package; Online staff—Feb. 27, 2006, Electronic News; http://www.edn.com/index.asp?layout=roadblock&sid=22066749&target=index%2Easp%3F.
Jens Pohl, Markus Graml, Peter Strobel, Rainer Steiner, Klaus Pressel, Gerald Ofner, Charles Lee; Package Optimization of a Stacked Die Flip Chip Based Test Package; Infineon Technologies AG, Regensburg, Germany, Dec. 31, 2004.
Vern Solberg; Advanced Package-Stacking fits more functions—Tessara Inc. http://www.eetasia.com/ART_8800451565_480200_756297c9200702.HTM, Feb. 15, 2007.
Barry Miles, Vladimir Perelman, Young Wook Heo, Akito Yshida and Richard Groover; 3-D Packaging for Wireless Applications; Amkor Technology Inc.; Chandler, Arizona—Feb. 1, 2004.

* cited by examiner

Primary Examiner — Leonardo Andújar
(74) Attorney, Agent, or Firm — Fletcher Yoder

(57) ABSTRACT

A die module and method for assembling such a die module is provided. For example, present embodiments include providing a substrate and coupling a first sub-stack to the substrate, wherein the first sub-stack includes two or more die arranged in a first shingle stack configuration relative to one another such that an upper portion of each die in the first sub-stack is accessible, the first shingle stack configuration having a first skew. Further, present embodiments include stacking a second sub-stack on top of the first sub-stack, wherein the second sub-stack includes two or more die arranged in a second shingle stack configuration relative to one another such that an upper portion of each die in the second sub-stack is accessible, the second shingle stack configuration having a second skew that is different than the first skew.

13 Claims, 7 Drawing Sheets

FIG. 3
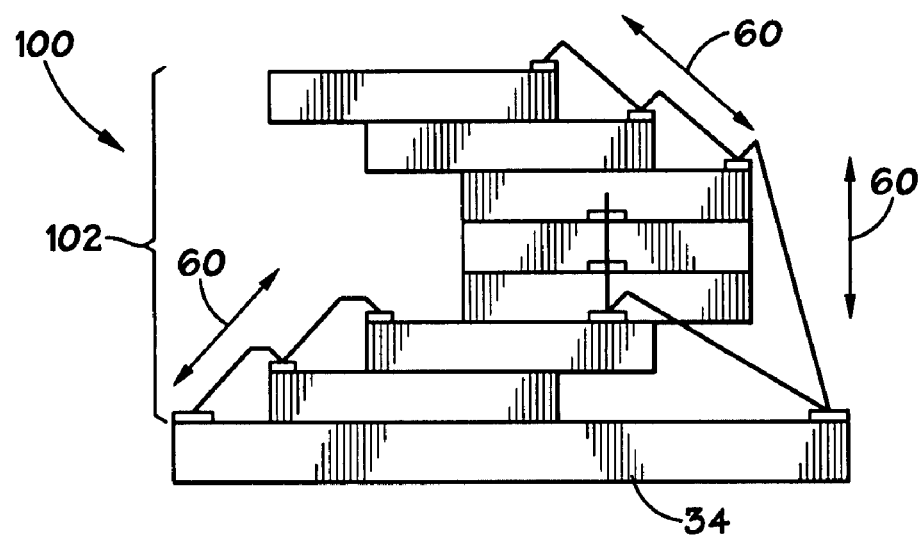
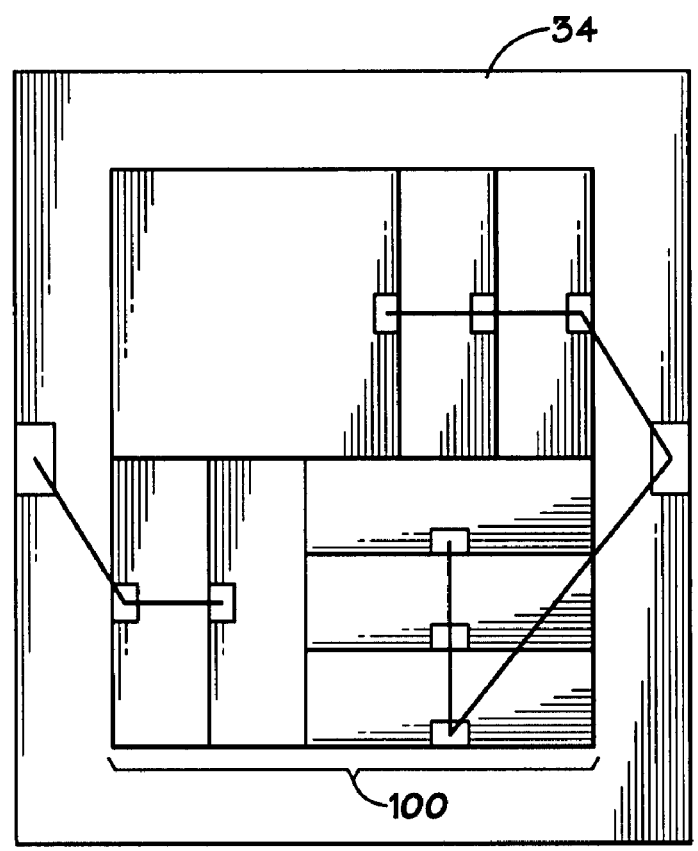
FIG. 3A

PACKAGE STRUCTURE FOR MULTIPLE DIE STACK

BACKGROUND

1. Field of Embodiments of the Invention

Embodiments of the present invention relate generally to semiconductor processing and, more particularly, to a stacked die module and techniques for forming a stacked die module.

2. Description of the Related Art

This section is intended to introduce the reader to various aspects of art that may be related to various aspects of embodiments of the present invention, which are described and/or claimed below. This discussion is believed to be helpful in providing the reader with background information to facilitate a better understanding of the various aspects of embodiments of the present invention. Accordingly, it should be understood that these statements are to be read in this light, and not as admissions of prior art.

Packaging of electrical circuits is a key element in the technological development of systems implementing electrical components. Various techniques have been developed to meet the continued demands for improving system performance and capability. Engineers have been challenged with finding ways to increase hardware capabilities while the space in which to provide these hardware capabilities continues to decrease.

One technique for saving valuable system board geography is to implement die stacking techniques. A standard integrated circuit package, such as a memory or processor package, may include a substrate whereon chips or die may be stacked. A first die may be adhesively and/or electrically coupled to a substrate. A second die may then be stacked on top of the first die and adhesively and/or electrically coupled to the first die. In addition or alternatively, the second die may be electrically coupled directly to the substrate by bondwires or leads, for example, or electrically coupled to the substrate through vias in the first die. A third die may then be attached to the second die, and so forth.

While conventional stacking techniques provide more hardware capability in smaller areas by eliminating the need to populate additional substrate surface area for each individual die used in the system, these techniques have several disadvantages. One problem is that die stacks are often limited in the number of die they may contain because of inefficiencies associated with accessing each die in a die stack. For example, traditional die stacks that utilize bondwires for communicative coupling may employ a shingle stack arrangement to facilitate access to an attachment point for the bondwires on each die of a die stack. In a conventional shingle stack arrangement, each die is slightly shifted in one direction with respect to the die on which it is placed. This shift exposes a portion along the edge of each die, which provides an access point for communication with the die. However, continually skewing the shingle stack with additional die will cause the die stack to become overly elongate in the direction of the skew. This can create an obstacle to accessing exposed surfaces under the overhang created by the die stack, such as the surface of the substrate. Further, traditional shingle stacks can become unstable with the addition of too many die.

BRIEF DESCRIPTION OF THE DRAWINGS

FIGS. 3 and 3A illustrate side and top views of a die package including substrates arranged in a substantially spiral orientation in accordance with embodiments of the present techniques.

DETAILED DESCRIPTION OF SPECIFIC EMBODIMENTS

Embodiments of the present invention are directed to a die stack structure for integrated circuit packaging that facilitates inclusion of additional die within a single integrated circuit package while maintaining a limited footprint. More specifically, embodiments of the present invention relate to employing multiple sub-stacks in a die stack of an integrated circuit package such that the die stack provides stability, while also facilitating communicative access to the die in the die stack and access to a substrate from which the die stack extends.

In accordance with present embodiments, each sub-stack of a die stack may include multiple die arranged in a shingle stack orientation such that an upper die, which is stacked atop a lower die in the sub-stack, is slightly offset from the lower die in a specific direction. This orientation results in exposing a portion of an upper surface of the lower die, which facilitates access to the lower die. Each sub-stack may include a number of die, each disposed slightly offset in a particular direction with respect to the die below it, such that the sub-stack is skewed in the direction. In accordance with present embodiments, multiple sub-stacks with skews in different directions are combined to form a single die stack, wherein the sub-stacks are formed with alternating skew directions. By forming the die stack with multiple sub-stacks having different and alternating skews, the die stack may be provided with improved stability and a reduced footprint relative to conventional die stacks. A die stack including multiple sub-stacks having alternating skews in accordance with present embodiments may be referred to as a "multiple die stack."

Figure 1:
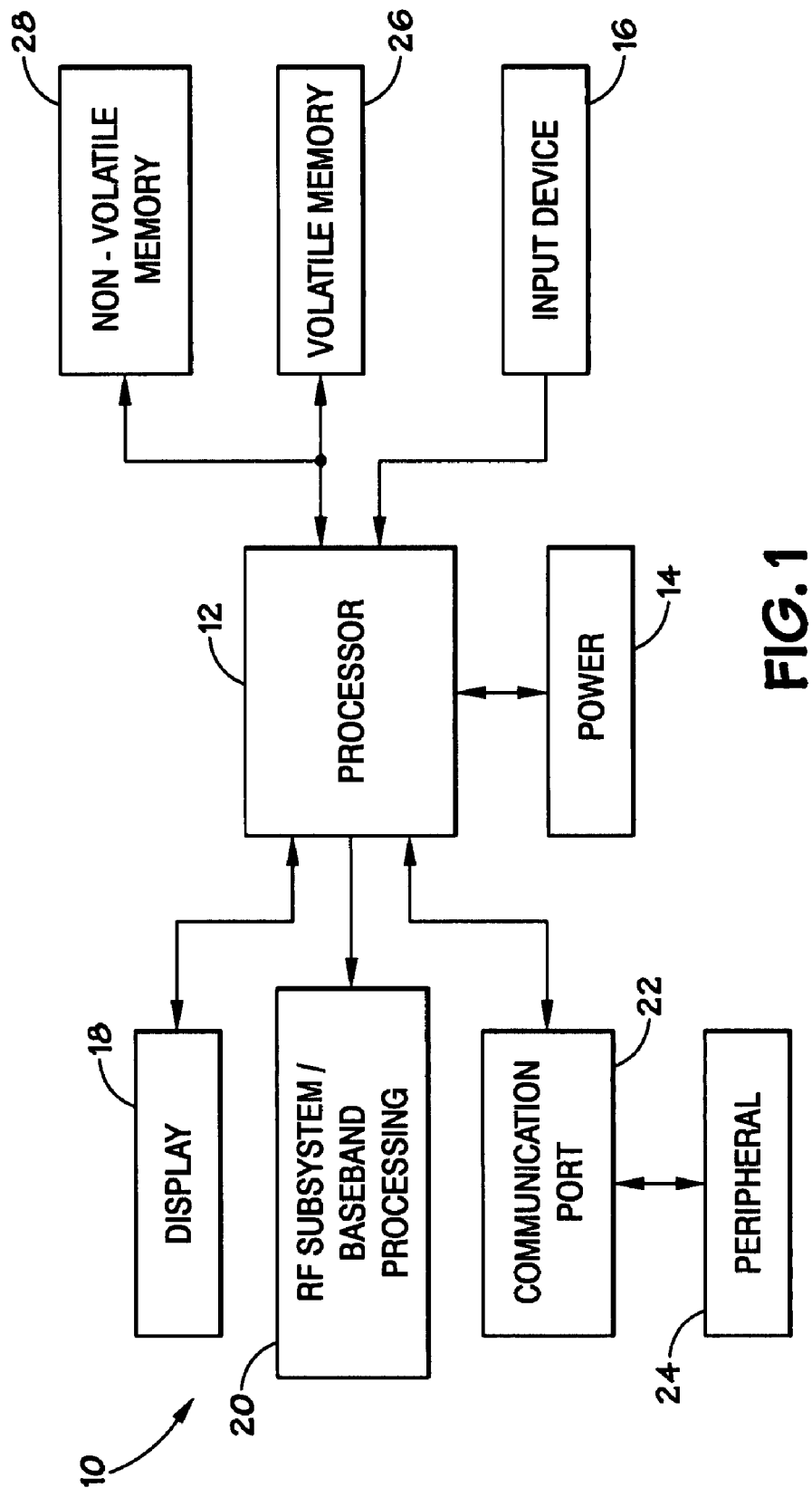
FIG. 1 illustrates a block diagram of a processor-based system in accordance with embodiments of the present techniques.

Turning now to the drawings, and referring initially to FIG. 1, a block diagram depicting a processor-based device, generally designated by the reference numeral 10, is illustrated. Electronic devices, such as device 10, may include features in accordance with embodiments of the present invention. The device 10 may be any of a variety of different types, such as a computer, pager, cellular telephone, personal organizer, control circuit, and so forth. In device 10, as with any typical processor-based device, a signal processor 12, such as a microprocessor, controls many of the functions of the device 10.

As is typical with such devices, the device 10 includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface or input device 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display. Furthermore, a radio frequency (RF) subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 based generally on software programming, memory is coupled to the processor 12 to store and facilitate execution of the program. For instance, the processor 12 may be coupled to volatile memory 26, which may include dynamic random access memory (DRAM) and/or static random access memory (SRAM). The processor 12 may also be coupled to non-volatile memory 28. The non-volatile memory 28 may include a read only memory (ROM), such as an erasable programmable read-only memory (EPROM) or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk or tape drive memory.

Figure 2:
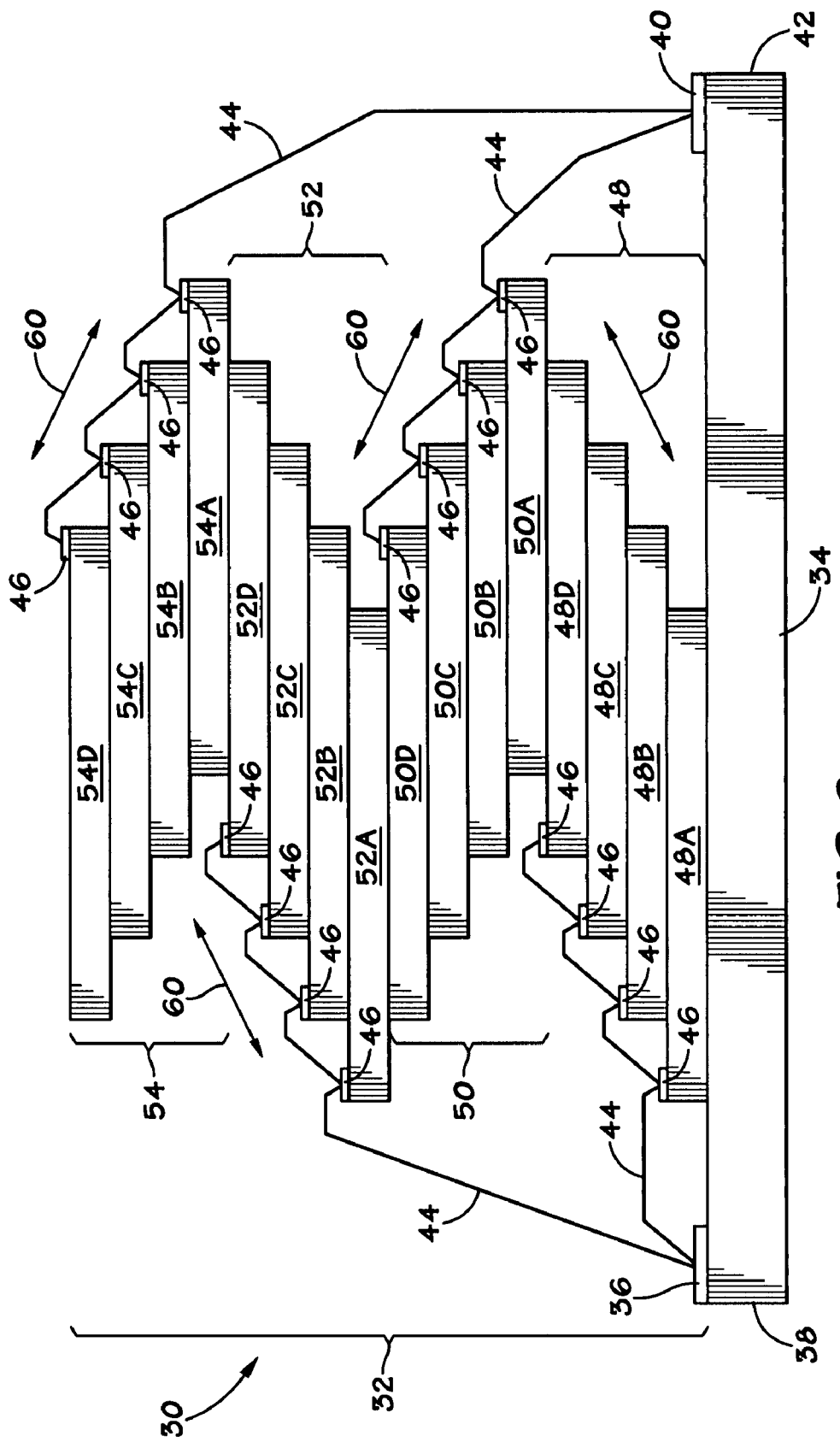
FIG. 2 illustrates a cross-sectional view of a die package in accordance with embodiments of the present techniques.

FIG. 2 is a cross-sectional view of a die package 30 in accordance with present embodiments. The die package 30 is generally representative of various components that may be employed in a device or system in accordance with present embodiments, such as the system 10. For example, the die package 30 may comprise a memory die such that the die package 30 is configured for use in the volatile memory 26 of the system 10. In another example, the die package 30 may comprise a feature of the processor 12 of the system 10.

The die package 30 includes a multiple die stack 32 disposed on a substrate 34 in accordance with present embodiments. In the illustrated embodiment, the substrate 34 includes a first bond pad 36 positioned near a first edge 38 of the substrate 34 and a second bond pad 40 positioned near a second edge 42 of the substrate 34. In other embodiments, the substrate 34 may include multiple bond pads that may be positioned in different locations on the substrate 34. For example, in one embodiment wherein the substrate 34 is generally rectangular, at least one bond pad may be disposed proximate each of the four edges of the substrate 34.

The bond pads 36 and 40 are utilized to facilitate communicative coupling between the die of the multiple die stack 32 and the substrate 34. Specifically, in the illustrated embodiment, bondwires 44 electrically couple the substrate 34 and the die of the multiple die stack 32 by attaching the bond pads 36 and 40 on the substrate 34 to bond pads 46 on each of the die. In the illustrated embodiment, die are serially connected to one another in a daisy chain through the bondwires 44, thereby providing an electrical connection from each die to the substrate 34. In other embodiments, vias may be employed to couple some die in the multiple die stack 32 to the substrate 34. Also, in some embodiments, the bondwires 44 may be utilized to couple each of the die directly to the substrate 34. Further, other conductive materials may be employed (e.g., conductive ribbons or strips) in place of the bondwires 44 to facilitate electrical coupling throughout the package 30.

In the illustrated embodiment of FIG. 2, sixteen die are arranged to form the multiple die stack 32 on the substrate 34. Specifically, the multiple die stack 32 includes four sub-stacks, wherein each sub-stack includes four individual die. In the illustrated embodiment, the lowermost sub-stack is indicated by reference numeral 48; the sub-stack positioned immediately above the sub-stack 48 is indicated by reference numeral 50; the sub-stack positioned immediately above the sub-stack 50 is indicated by reference numeral 52; and the uppermost sub-stack is indicated by the reference numeral 54. In other embodiments, different numbers of die and sub-stacks may be employed. For example, present embodiments may include two or more sub-stacks that each include a varying number of die. Additionally, in some embodiments, vias may be employed in certain die to facilitate a combination of shingle stacking arrangements and arrangements wherein die are stacked directly on top of another without any offset. Such arrangements will be discussed in further detail below.

The lowermost die in each sub-stack of the die package 30 may be referred to as a base die. The base die of the lowermost sub-stack 48, is indicated by reference numeral 48A. The die positioned immediately above the base die 48A in sub-stack 48 is indicated by reference numeral 48B; the die positioned immediately above the die 48B is indicated by reference numeral 48C; and the die positioned immediately above the die 48C is indicated by reference numeral 48D. The corresponding die of each sub-stack of the multiple die stack 32 are similarly numbered. Specifically, sub-stack 50 includes die 50A, 50B, 50C and 50D; sub-stack 52 includes die 52A, 52B, 52C and 52D; and sub-stack 54 includes die 54A, 54B, 54C and 54D.

The base die 48A is mechanically and physically coupled directly to the substrate 34. This coupling may be achieved via any of various types of coupling. For example, the base die 48A of the lowermost sub-stack 48 may be adhesively coupled to the substrate 34 with a paste, epoxy, or the like. The remaining die of the sub-stack 48 are arranged in a shingle stack orientation with respect to one another and the base die 48A. Specifically, each die is successively shifted in a consistent direction with respect to the die beneath it such that a portion of the upper surface of each lower die is exposed and accessible. For example, the die 48B is coupled to the upper surface of the base die 48A such that the edges of the die 48B and the base die 48A are substantially parallel but unaligned. Specifically, relative to the edge of the base die 48A nearest the first edge 38 of the substrate 34, the respective edge of the die 48B is shifted nearer the second edge 42 of the substrate 34. This shift between die 48A and 48B results in exposing a portion of the upper surface of the base die 48A near the first bond pad 36. This exposed surface on the base die 48A includes the bond pad 46 for the base die 48A, which facilitates electrical coupling with the substrate 34. Specifically, having the exposed upper surface of the base die 48A near the first edge 38 of the substrate 34 facilitates coupling the base die 48A with the first bond pad 36 of the substrate 34. It should be noted that each die in a sub-stack may be arranged similarly, such that a portion of the upper surface is exposed on each die along the same side throughout the sub-stack, as illustrated in FIG. 2.

It should be noted that exposing the surface of each die of the sub-stack 48 nearest the bond pad 36 of the substrate 34 facilitates efficient electrical coupling of the bond pad 36 and the die of the sub-stack 48 employing the bondwire 44. Similar arrangements are made between the die throughout the multiple die stack 32, as illustrated in FIG. 2. However, some die are positioned to be more efficiently coupled with the bond pad 40 instead of the bond pad 36. In the illustrated embodiment, rather than coupling each of the bond pads 46 on each of the die directly to the bond pads 36 or 40 of the substrate 34, the bond pads 46 of each die of the multiple die stack 32 are serially connected to one another. For example, the die 48B is electrically coupled by a bondwire 44 to the base die 48A, which is in turn communicatively coupled to the bond pad 36 of the substrate 34. However, in other embodiments, each die may be directly coupled to a bond pad or the substrate 34 through bondwires.

Each die in a sub-stack may be positioned in a shingle stack orientation with respect to the die immediately beneath it in accordance with present embodiments to establish a slant or skew 60 of the sub-stack. Multiple sub-stacks with varying skews may be positioned on top of one another to form a multiple die stack, such as the multiple die stack 32, in accordance with present embodiments. As illustrated in FIG. 2, the base die in an upper sub-stack 54 may be positioned in a shingle stack orientation consistent with the orientation of the die in the sub-stack 52 beneath the upper sub-stack 54. For example, the sub-stack 54 is coupled to the uppermost die 52D of the sub-stack 52, and the base die 54A in the sub-stack 54 is positioned in a shingle stack orientation with respect to the uppermost die 52D of the sub-stack 52 such that it assimilates with the skew 60 of the sub-stack 52.

The base die of a sub-stack, such as the base die 54A, may act as a transition point. For example, beginning with the base die of an upper sub-stack, the die of the upper sub-stack may be electrically coupled to a different bond pad of a substrate than that of the die of the sub-stack immediately below the upper sub-stack. For example, the die of the sub-stack 52 are coupled to the bond pad 36, while the die of the sub-stack 50 are coupled to the bond pad 40. Further, beginning with the base die of an upper sub-stack, the upper sub-stack may be skewed in a direction substantially opposite that of the sub-stack on which it is positioned. Specifically, for example, die 50B, 50C and 50D are respectively positioned atop the base die 50A such that the sub-stack 50 has a skew that is opposite that of the sub-stack 48.

In some embodiments, various sub-stacks may include various different skews. For example, FIG. 3 illustrates side and top views of a package 100 in accordance with present embodiments. The package 100 includes a multiple die stack 102, which includes a number of sub-stacks that create a spiral effect through alternating the skews 60 of each sub-stack relative to one another. By alternating the skews 60 of the sub-stacks, space is conserved on the substrate 34 and electrical access is provided to the die that make up the multiple die stack 102.

Figure 4:
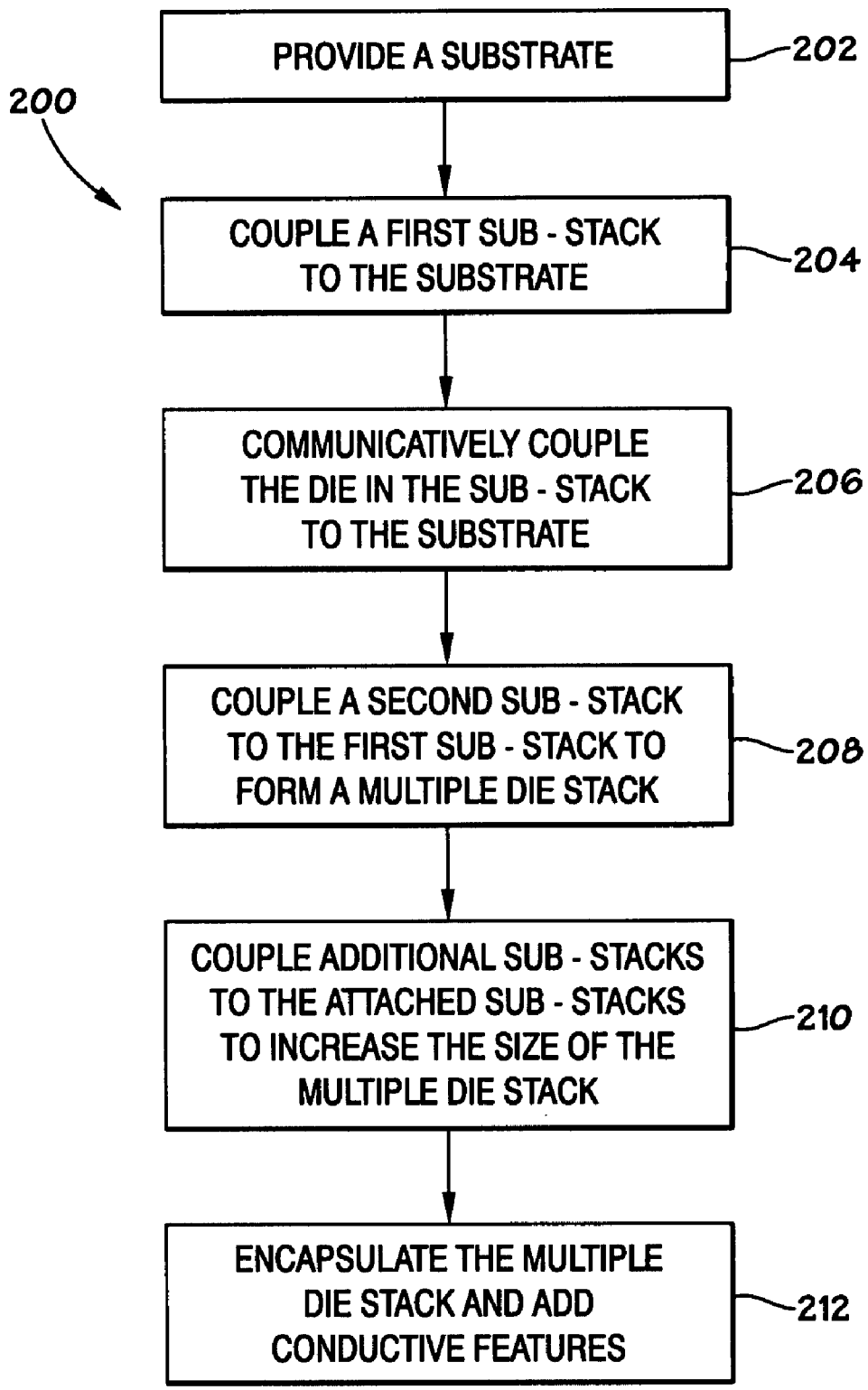
FIG. 4 is a block diagram representing a method of forming a device or package in accordance with embodiments of the present techniques.

FIG. 4 is a block diagram representing a method in accordance with embodiments of the present invention. The method is generally referred to by reference numeral 200. Specifically, the method includes providing a substrate (block 202), coupling a first sub-stack to the substrate (block 204), electrically coupling the die in the sub-stack to the substrate (block 206), and positioning additional sub-stacks above the first sub-stack to form a multiple die stack (blocks 208 and 210). Further, the method 200 includes encapsulating the multiple die stack and adding conductive features (block 212).

The method 200 results in the assembly of a device, package or module including a multiple die stack, such as the multiple die stack 32, in accordance with present embodiments. The method 200 illustrated is FIG. 4 is merely representative of various methods that may be utilized in accordance with present embodiments. In other methods in accordance with present embodiments, the resulting assembled multiple die stack may include features different from those provided in method 200 while maintaining core aspects of embodiments of the present invention.

Figure 5:
FIG. 5 illustrates a side view of a substrate that may be utilized in accordance with embodiments of the present techniques.

The method 200 begins with providing a substrate, as represented by block 202. The provided substrate may include a number of bond pads disposed thereon. For example, FIG. 5 is a side view of a substrate 300 including a first bond pad 302 and a second bond pad 304. The bond pads 302 and 304 may be provided on the substrate 300 to facilitate electrical coupling of the substrate to die of a multiple die stack, which will eventually be coupled with the substrate. The substrate 300, as illustrated in FIG. 5, is representative of a typical substrate that may be provided in block 202. Accordingly, the substrate 300 is referenced throughout the discussion of method 200 as an example substrate to provide context for assembly of the device or module in accordance with present embodiments.

Block 204 of method 200 represents coupling a first sub-stack to the substrate 300. In one embodiment, block 204 may include forming a sub-stack by coupling a base die to the substrate 300 and then stacking one die at a time on top of another beginning with the base die. In another embodiment, a sub-stack may be formed separate from the substrate 300 and then attached to the substrate as a unit. For example, sub-stacks may be formed separate from the substrate utilizing techniques such as those discussed in U.S. Pat. No. 6,682, 955, the relevant portions of which are herein incorporated by reference.

Figure 6:
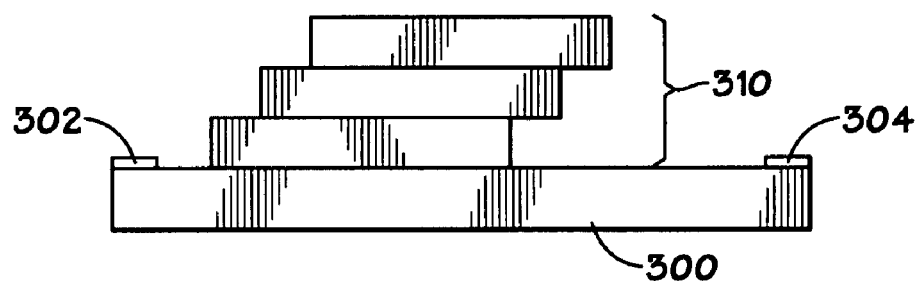
FIG. 6 illustrates a side view of a module including an initial sub-stack with die arranged in a shingle stack orientation in accordance with embodiments of the present techniques.

In one embodiment, the sub-stack may be formed such that the die of the sub-stack are arranged in a shingle stack orientation with respect to one another. That is, each die in the sub-stack may be offset with respect to the die on which it is stacked. The offset is generally in the same direction such that a portion of the upper surface of each die is exposed along the same side throughout the sub-stack. For example, FIG. 6 is a side view of a sub-stack 310 coupled to the substrate 300 and arranged in a shingle stack orientation. This facilitates efficient electrical access to each die of the sub-stack. It should be noted that, if some die have different sizes, corresponding edges of the die may be offset.

Figure 7:
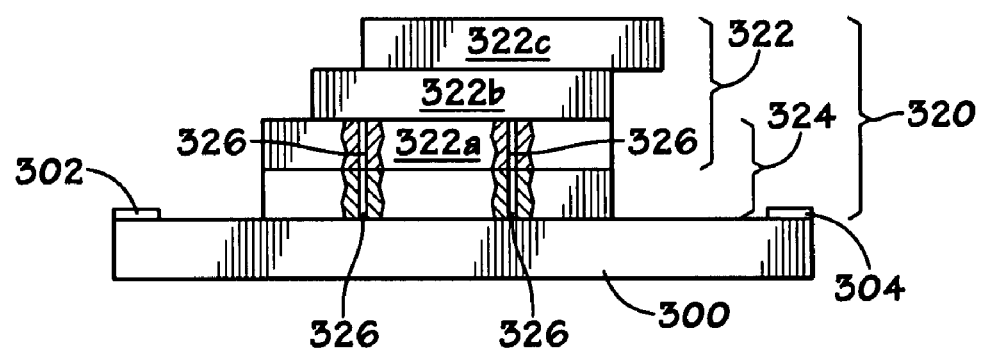
FIG. 7 illustrates a cross-sectional view of a module including an initial sub-stack with die arranged in both a shingle stack orientation and in direct alignment in accordance with embodiments of the present techniques.

In other embodiments certain die in a sub-stack may be arranged in something other than a shingle stack orientation. For example, in some embodiments the sub-stack immediately adjacent the substrate may include die that are arranged such that they are directly aligned with one another. Such die may couple to the substrate and/or other die through conductive vias formed therethrough. For example, FIG. 7 is a cross-sectional view of a sub-stack 320 including die arranged in both a shingle stack orientation and die arranged in direct alignment. The die arranged in the shingle stack orientation are designated by reference numeral 322. The die arranged in direct alignment are designated by reference numeral 324 and include vias 326 therethrough. It may be desirable to limit the use of vias, such as vias 326, to die that are positioned near the substrate to reduce complications in alignment. It should be noted that the shingle stack 322 includes a die 322a and a die 322b that are arranged such that they are aligned on their right edges and positioned based on a variation in their relative size to form a shingle stack orientation between the two die. Also, it should be noted that a die 322c overhangs the die 322b, and these die are also in a shingle stack orientation with respect to each other.

Figure 8:
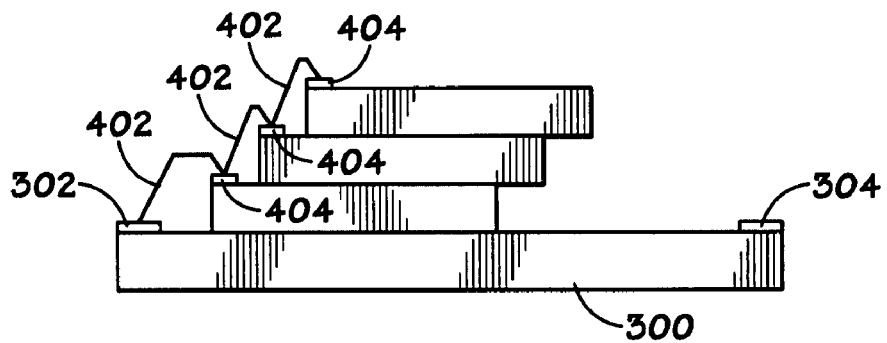
FIG. 8 illustrates a side view of each die of a sub-stack coupled to a bond pad of a substrate with bondwires in accordance with embodiments of the present techniques.

Block 206 represents electrically coupling the die in the sub-stack (e.g., sub-stack 310 or sub-stack 320) to the substrate 300. Once a sub-stack is in place, it may be desirable to attach bondwires between the bond pads (e.g., bond pad 302 or bond pad 304) of the substrate 300 and the bond pads of each die. For example, FIG. 8 illustrates bondwires 402 disposed between the bond pad 302 and bond pads 404 on each of the die. It may be beneficial to electrically couple the die with the substrate prior to adding an additional sub-stack. Indeed, once an additional sub-stack is coupled to the top of a sub-stack already in place, the additional sub-stack may hinder access to the lower sub-stack, thus making proper attachment of the bondwires, or the like, difficult. In some embodiments, it may be desirable to wait until just before the specific die that would hinder access is added before coupling the die to the substrate with the bondwire. For example, in a piecewise construction, a base die of an upper sub-stack could be coupled to a lower sub-stack before adding bondwires to the lower sub-stack without hindering access. Additionally, in some embodiments, the bondwires may be attached to each die after it is positioned within the sub-stack. For example, upon placing a base die, the base die may be coupled to the substrate via the bondwire prior to coupling another die to the base die and so forth.

Figure 9:
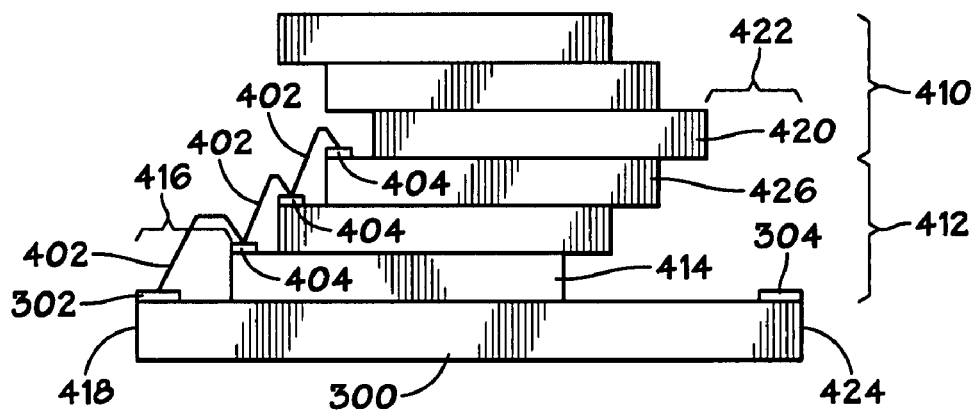
FIG. 9 illustrates a side view of a module including a multiple die stack formed from a lower sub-stack and an upper sub-stack in accordance with embodiments of the present techniques.

Block 208 represents mechanically coupling a second sub-stack to the first sub-stack, wherein the second sub-stack has a different skew than that of the first sub-stack. For example, FIG. 9 illustrates an upper sub-stack 410 deposited upon and mechanically coupled to a lower sub-stack 412. It should be noted that the base die of the first sub-stack (e.g., sub-stack 310 or sub-stack 320) coupled to the substrate 300 may be positioned nearer to one edge of the substrate 300 to provide room for the expanse of the sub-stack toward the other edge of the substrate 300. This expanse may result from the skew of the sub-stack. As discussed above, the skew is a result of arranging the die in a shingle stack orientation. In consideration of the planned skew for the sub-stack, it may be desirable to position the base die of the initial sub-stack on the substrate such that the positioning of each die and/or sub-stack added later will be appropriate.

The positioning of the base die coupled to the substrate 300 relative to the substrate 300 may depend on the number of die that will be included in the multiple die stack, the size of the die, the size of the substrate, the offset between the die in a shingle stack orientation and so forth. For example, it may be desirable to arrange the die in a lower sub-stack such that the base die of an upper sub-stack positioned adjacent the lower sub-stack will be a substantially equal distance from an edge of the substrate as the base die of the lower sub-stack. For example, in FIG. 9, the upper sub-stack 410 and the lower sub-stack 412 are shown. A base die 414 of the lower sub-stack 412 is a distance 416 from a first edge 418 of the substrate 300 and a base die 420 of the upper sub-stack 410 is a substantially equal distance 422 from a second edge 424 of the substrate 300. In some embodiments, the distance the sub-stack spans from one edge of the substrate to the other may be adjusted by utilizing different sized die in the sub-stack.

Figure 10:
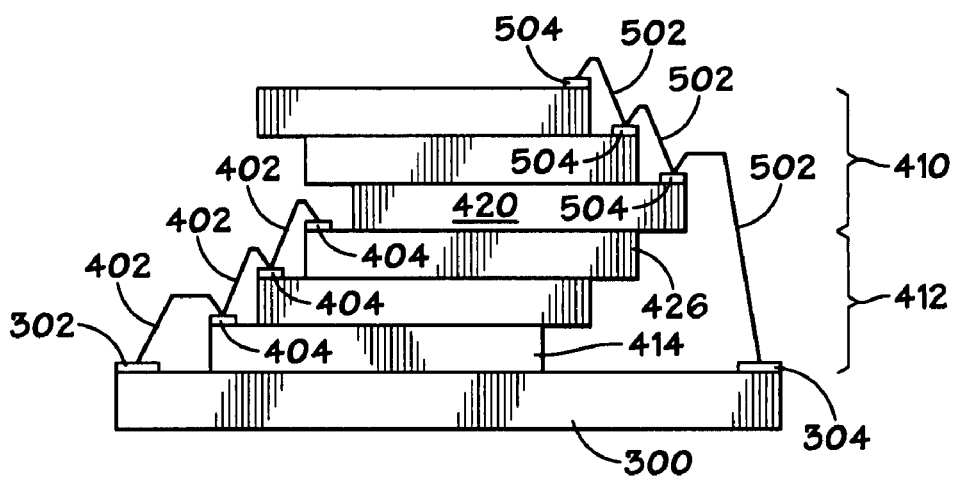
FIG. 10 illustrates the module of FIG. 9, wherein the die of the upper and lower sub-stacks are coupled to different bond pads of the substrate with bondwires in accordance with embodiments of the present techniques.

It should be noted that the base die 420 of the upper sub-stack 410 is offset from an upper most die 426 of the lower sub-stack 420 in the same direction as the offsets of the die that make up the lower sub-stack 412. This facilitates coupling all of the die in each of the sub-stacks to a single bond pad (e.g., bond pad 302 or bond pad 304) or to bond pads located on the same edge of the substrate 300. As with the lower sub-stack 412, it may be desirable to couple the die of the upper sub-stack 410 to the nearest bond pad (i.e., bond pad 304) on the substrate 300 prior to the addition of a further sub-stack deposited on the upper side of the upper sub-stack 410. For example, as illustrated in FIG. 10, bondwires 502 may be added to serially couple bond pads 504 on each of the die in the upper sub-stack 410 to the bond pad 304 before another sub-stack is added atop the upper sub-stack 410.

Block 210 represents coupling a third sub-stack to the second sub-stack, coupling a fourth sub-stack to the third sub-stack, and so forth. The sub-stacks combine to form a multiple die stack in accordance with present embodiments. The sub-stacks may be respectively arranged as discussed above with respect to the positioning of the first and second sub-stacks in block 206. Further, after the addition of a sub-stack or during the construction of a sub-stack, each die in the sub-stack may be directly or indirectly electrically coupled (e.g., via bondwire) to a bond pad of the substrate. For example, the embodiment illustrated in FIG. 2 is representative. Indeed, the die package 30 includes four sub-stacks 48, 50, 52 and 54 coupled together and to the substrate 300 to form the multiple die stack 32 in accordance with present embodiments.

Figure 11:
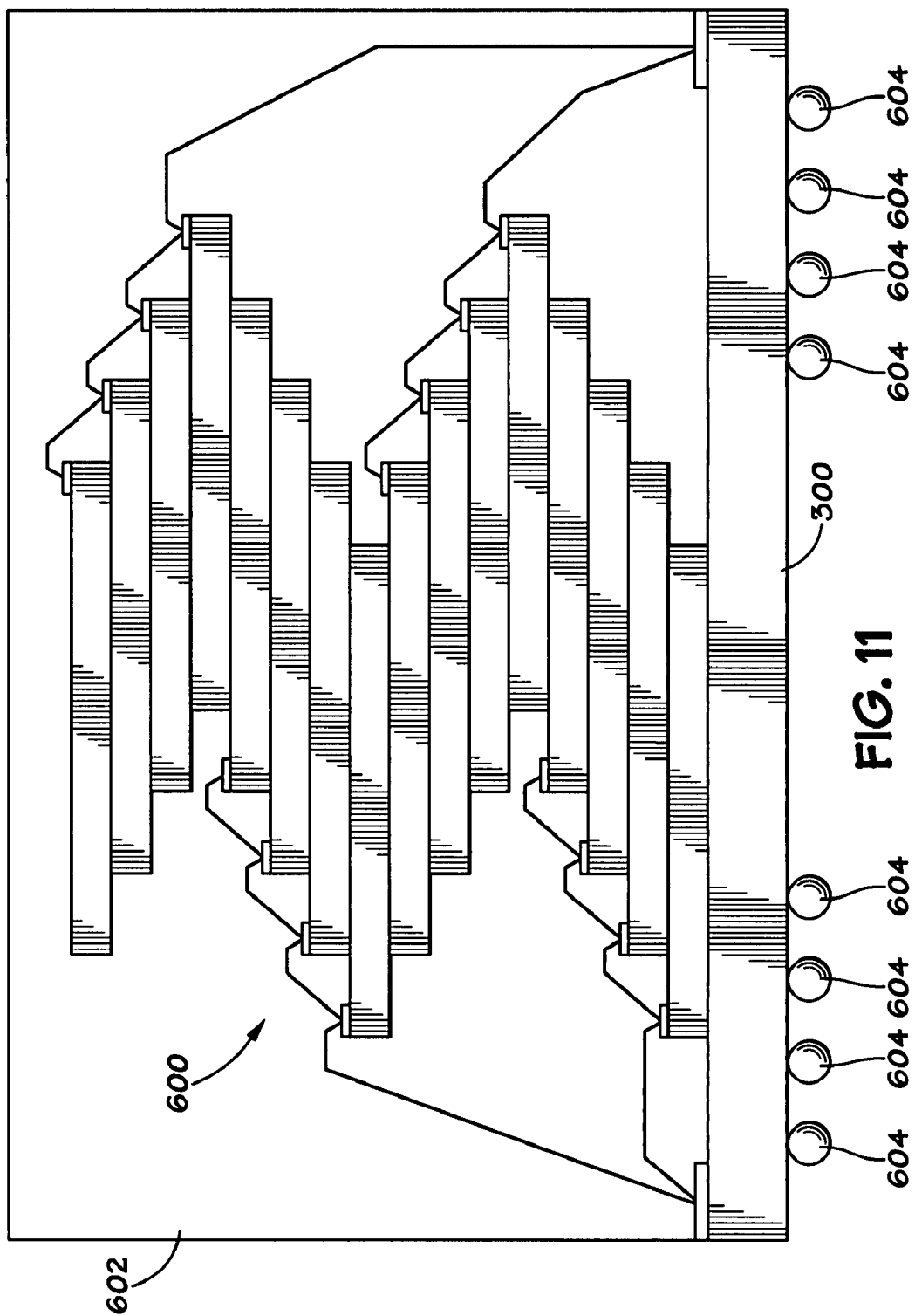
FIG. 11 illustrates a cross-sectional view of a package including a multiple die stack encapsulated in an encapsulant, wherein the substrate of the package includes conductive features disposed thereon in accordance with embodiments of the present techniques.

Block 212 represents encapsulating the multiple die stack and its bondwires, and adding conductive features to the substrate. The encapsulant may include any of various encapsulants known in the art, such as a non-conductive epoxy or resin. The conductive features may include conductive material arranged to facilitate electrical coupling of the die package (e.g., 30) to another device or system. For example, the package formed through method 200 may employ ball grid array (BGA) technology. Specifically, the conductive features may include conductive balls (e.g., solder balls). As an example of a package including features such as those provided in block 212, FIG. 11 is a side view of the substrate 300 coupled with a multiple die stack 600, wherein the multiple die stack 600 is encapsulated by an encapsulant 602, and solder balls 604 have been coupled to the underside of the substrate 300 in accordance with present embodiments.

While embodiments of the invention may be susceptible to various modifications and alternative forms, specific embodiments have been shown by way of example in the drawings and have been described in detail herein. However, it should be understood that embodiments of the invention are not intended to be limited to the particular forms disclosed. Rather, embodiments of the invention cover all modifications, equivalents, and alternatives falling within the spirit and scope of the embodiments as defined by the following appended claims.

What is claimed is:

1. A die module, comprising:
a substrate comprising a first bond pad positioned near a first side of the substrate and a second bond pad positioned near a second side of the substrate, wherein the first side of the substrate is opposite the second side of the substrate;
a first die of a first sub-stack coupled to the substrate, the first die of the first sub-stack comprising a first die bond pad positioned on top of and near an edge of the first die of the first sub-stack that is closest to the first side of the substrate;
a second die of the first sub-stack coupled to the first die of the first sub-stack, the second die of the first sub-stack comprising a second die bond pad positioned on top of and near an edge of the second die of the first sub-stack that is closest to the first side of the substrate, wherein the second die of the first sub-stack is aligned with and shifted in a first direction relative to the first die of the first sub-stack such that the first die bond pad is not covered by the second die of the first sub-stack, a skew of the first sub-stack being toward the second side of the substrate from the first side of the substrate;
a first die of a second sub-stack coupled to an uppermost die of the first sub-stack, wherein the first die of the second sub-stack is aligned with and shifted in the first direction relative to the uppermost die of the first sub-stack, the first die of the second sub-stack comprising a third die bond pad positioned on top of and near an edge of the first die of the second sub-stack that is generally perpendicular to the edge of the first die of the first sub-stack;
a second die of the second sub-stack coupled to the first die of the second sub-stack such that the third die bond pad is not covered by the second die of the second sub-stack, the second die of the second sub-stack comprising a fourth die bond pad positioned on top of and near an edge of the second die of the second sub-stack that is closest to the edge of the first die of the second sub-stack, wherein the second die of the second sub-stack is aligned with and shifted in a second direction relative to the first die of the second sub-stack, the second direction being generally perpendicular to the first direction, a skew of the second sub-stack being generally perpendicular relative to the skew of the first sub-stack; and
a first die of a third sub-stack coupled to an uppermost die of the second sub-stack, wherein the first die of the third sub-stack is aligned with and shifted in the second direction relative to the uppermost die of the second sub-stack, the first die of the third sub-stack comprising a fifth die bond pad positioned on top of and near an edge of the first die of the third sub-stack that is generally perpendicular to the edge of the first die of the second sub-stack; and
a second die of the third sub-stack coupled to the first die of the third sub-stack such that the fifth die bond pad is not covered by the second die of the third sub-stack, wherein the second die of the third sub-stack is aligned with and shifted toward the first side of the substrate relative to the first die of the third sub-stack, a skew of the third sub-stack being generally opposite the skew of the first sub-stack and toward the first side of the substrate from the second side of the substrate.

2. The die module of claim 1, comprising a third die of the first sub-stack coupled to the second die of the first sub-stack, wherein the third die of the first sub-stack is shifted in the first direction relative to the second die of the first sub-stack.

3. The die module of claim 1, wherein the first die of the first sub-stack comprises at least one via forming a conductive pathway from a top surface of the first die to a bottom surface of the first die.

4. The die module of claim 1, comprising a fourth sub-stack coupled to an uppermost die of the third sub-stack, a skew of the fourth sub-stack being opposite the skew of the second sub-stack.

5. The die module of claim 1, wherein the die of the first sub-stack, the second sub-stack and the third sub-stack are electrically coupled to the substrate with bondwires.

6. The die module of claim 1, wherein the first and second die bond pads are electrically coupled to the first bond pad of the substrate with bondwires, and the third, fourth, and fifth die bond pads are coupled to the second bond pad of the substrate with bondwires.

7. A multiple die stack, comprising:
a first sub-stack of die coupled to one another, wherein the die of the first sub-stack are aligned and offset in a first direction with respect to one another such that a skew of the first sub-stack is in the first direction;
a second sub-stack of die coupled to one another, wherein the die of the second sub-stack are aligned and offset in a second direction with respect to one another such that a skew of the second sub-stack is in the second direction, wherein a lowermost die of the second sub-stack is stacked on an uppermost die of the first sub-stack and the first direction is different than the second direction; and
a third sub-stack of die coupled to one another, wherein the die of the third sub-stack are aligned and offset in a third direction with respect to one another such that a skew of the third sub-stack is in the third direction, wherein a lower most die of the third sub-stack is stacked on an upper most die of the second sub-stack and the third direction is different than the second and first directions, and
wherein the skews of the first, second, and third sub-stacks are such that the first, second and third sub-stacks form a spiral.

8. The multiple die stack of claim 7, wherein the first sub-stack comprises three or more die and the second sub-stack comprises three or more die.

9. The multiple die stack of claim 7, wherein the multiple die stack is separate from a substrate and configured to couple with the substrate.

10. The multiple die stack of claim 7, wherein each die of the first, second, and third sub-stacks comprises a die bond pad on a top portion of each die that is not covered by another die of the multiple die stack.

11. The multiple die stack of claim 10, wherein each die bond pad of the first sub-stack is coupled to a substrate bond pad positioned on a first side of a substrate.

12. The multiple die stack of claim 11, wherein each die bond pad of the second sub-stack is coupled to a substrate bond pad positioned on a second side of the substrate.

13. The multiple die stack of claim 11, wherein each die bond pad of the second and third sub-stacks is coupled to a substrate bond pad positioned on a second side of the substrate.

* * * * *